US007795942B2

(12) United States Patent
Quan et al.

(10) Patent No.: US 7,795,942 B2

(45) Date of Patent: Sep. 14, 2010

(54) STAGE BY STAGE DELAY CURRENT-SUMMING SLEW RATE CONTROLLER

(75) Inventors: Yong Quan, Chengdu (CN); Guosheng Wu, Chengdu (CN)

(73) Assignee: IPGlobal Microelectronics (SiChuan) Co., Ltd., High-Tech Incubation Park, Chengdu, Sichuan Province (CN)

( * ) Notice: Subject to any disclaimer, the term of this patent is extended or adjusted under 35 U.S.C. 154(b) by 0 days.

(21) Appl. No.: 12/475,523

(22) Filed: May 31, 2009

(65) Prior Publication Data

US 2010/0052758 A1 Mar. 4, 2010

(30) Foreign Application Priority Data

Aug. 26, 2008 (CN) ........................ 2008 1 0045892

(51) Int. Cl.
*H03H 11/26* (2006.01)

(52) U.S. Cl. ....................... 327/261; 327/170; 327/276; 327/278; 327/283

(58) Field of Classification Search ................. 327/170, 327/261, 263–264, 269–272, 276–278, 283–285
See application file for complete search history.

(56) References Cited

U.S. PATENT DOCUMENTS

| | | | | | |
|---|---|---|---|---|---|
| 4,797,586 | A | * | 1/1989 | Traa | 327/276 |
| 5,424,669 | A | * | 6/1995 | Teggatz et al. | 327/270 |
| 5,859,552 | A | * | 1/1999 | Do et al. | 327/170 |
| RE40,971 | E | * | 11/2009 | Sutardja | 341/144 |

* cited by examiner

*Primary Examiner*—An T Luu

(57) ABSTRACT

A stage by stage delay current-summing slew rate controller includes a delay controller, a delay cell array, a current source array, a switch array, a load. The delay cell array includes N delay cells, the switch array includes N switches, and the switch includes N current sources, wherein N>1. The delay controller is connected with the control ports of the delay cells respectively, and the delay cells are connected with the control terminal of the switches respectively. One of the connecting terminals of the switch is connected with the output end of the current source, and the other end of the connecting terminals of the switch is connected with one end of the load, and the other end of the load is connected to the ground.

10 Claims, 4 Drawing Sheets

STAGE BY STAGE DELAY CURRENT-SUMMING SLEW RATE CONTROLLER

BACKGROUND OF THE PRESENT INVENTION

1. Field of Invention

The present invention relates to a current source type voltage slew rate controller to drive capacitive load, and more particularly to a stage by stage delay current-summing slew rate controller.

2. Description of Related Arts

The circuit comprises a current drive and a load, wherein the load may be a capacitor, a parallel of a capacitor and a resistor, or other equivalent load, as shown in FIG. 1.

Slew rate is to measure the changing rate of the voltage on the node. The mathematical expression is $\partial V/\partial t$.

Generally, the slew rate $SR=(I(t)-V_{OUT}(t)/R)/C$.

$I(t)$ is the transient current of the current source, $V_{out}(t)$ is the transient voltage of the output node, R and C are the equivalent resistor and capacitor of the output load respectively. If R!=0, the slew rate (SR) will become small with the increasing of the output voltage, which is not good for the signal establishment. Conventionally, there are mainly three ways of slew rate adjustment.

1. Adjust the load;
2. Adjust the input current;
3. Introduce compensation loop.

In prior art No. 1, adjust the load capacitor with the changing of the output voltage, in another word, reduce C to compensate the reduction of I; or in prior art No. 2, increase I(t) to compensate the shunt of the bypass resistor; or in prior art No. 3, introduce additional circuit to compensate the bypass current of the resistor.

The drawbacks of the above-mentioned three ways of slew rate adjustment are illustrated as follows.

In prior art No. 1, basically the capacitor-voltage curve is determined by device fabrication, and appears to be none-linear, which means the slew rate is also none-linear and hard to control.

In art No 2, changing the driving current require us to control the base voltage of a bipolar or the gate voltage of a MOSFET. However, such control mechanism is rather complex and prone to be disturbed. Meanwhile, the precision such controlling is highly process dependent.

In art No. 3, introducing compensation feedback loop will solve the problem in art No. 1 and art No. 2. However, in general the bandwidth of a feedback loop can not satisfy the demand of a high speed transmission circuit.

SUMMARY OF THE PRESENT INVENTION

An object of the present invention is to provide a stage by stage delay current-summing slew rate controller, which obtains controllable current source by linearly summing N stages mirror current, so as to adjust the output voltage slew rate.

Accordingly, in order to accomplish the above object, the present invention provides a stage by stage delay current-summing slew rate controller, which includes a delay controller, a delay cell array, a current source array, a switch array, and a load. The delay cell array includes N delay cells, the switch array includes N switches, and the switch includes N current sources, wherein N>1. The delay controller is connected with the control ports of the delay cells respectively, and the delay cells are connected with the control terminal of the switches respectively. One of the connecting terminals of the switch is connected with the output end of the current source, and the other end of the connecting terminals of the switch is connected with one end of the load, and the other end of the load is connected to the ground.

The switches are connected with the current sources respectively in series.

The input ends of the current sources are connected with the power supply in parallel.

The current source is mirror current source.

The work flow of the stage by stage delay current-summing slew rate controller is illustrated as follows.

Firstly, the delay cell array delays the input signal, the delay controller controls the delay time of each delay cell and gates the delay cell needed to work, then output signals of delay cells of the delay cell array control the corresponding switches of the switch array respectively, lastly the current sources of the current source array combine and output current under the control of the corresponding switches respectively. The output current drives the load to produce output voltage. During the working process, the output current and voltage are controllable, so that the output voltage slew rate can be controlled.

The delay controller also controls the amount of the delay of each delay cell, and the number of delay cell needed to work may change according to the actual need during the working process.

The delay cells of the delay cell array produce N-phase switch signals of different delay to drive the corresponding switches of the switch array and control the current sources, wherein N>1.

The switch of the switch array is to control the on and off of the corresponding current source of the current source array.

The load is driven by the N current sources of the current source array after combined, wherein N>1.

The output signals are produced by input signal passing through the 1 to N delay cells of the delay cell array respectively. The effectiveness of the output signals is determined by the input signal.

The output signals controlling the connection between the connecting terminal of the switches of and the load means that when the output signal is effective, the connecting terminal and the load are connected; when output signal is ineffective, the connecting terminal and the load are disconnected.

The principle of the stage by stage delay current-summing slew rate controller is illustrated as follows.

$$I_{OUT}(t)=\sum_{n=1}^{n=N} f(t-n*\Delta t)$$

When delta(t)=0, the current is not changed, so that SR does not need to be adjusted.

The current is becoming lager with time. When N is bigger, the adjusting is more precise; when the delta(t) is higher, the adjusting is more coarse.

Overall, $I_{out}$ is a combined current. For example, when $I_{out}(t)=I_0*u(t)$ (step signal), $I_{out}$ is a step-like section curve with N section of $I_0$, $2*I_0$, . . . $N*I_0$ respectively. The value $I_{out}$ of each section is constant, and the difference between the adjacent values of $I_{out}$ is $I_0$. The output wave is a steeper and steeper ascending wave. Adjusting N and delta(t) can change the width of each wave section and the overall ascending speed (equivalent slop). If N is big enough, the current is almost continuous, and rise linearly with time. When N→∞, $\partial I/\partial = I_0/\Delta t$ (constant).

Because $SR=(I(t)-V_{OUT}(t)/R)/C$, if SR needs to be constant, the compensate current I-compensate$=V_{OUT}(t)/R=I_C*t/(R*C)$, $\partial I/\partial = I_C/(R*C)$, that is to demand $I_C/(R*C)=I_0/\Delta t$, wherein $I_c$ is the current of the capacitor that should be approximate equal to 0, so that $(R*C)=\Delta t$.

If change $I_{out}(t)$, various kinds of output current can be produced by superposition. This becomes an extended application of this method.

Change f(t) or Δt and N, various kinds of output current can be produced by superposition. The superposition result can produce various driving effect, so that the slew rate of the output voltage can be customized.

The benefit of the present invention is illustrated as follows. The present invention obtain obtains controllable current source by linearly summing N stages mirror current, so as to adjust the output voltage slew rate. The present invention can be controlled by program, and is simple in structure, has wide adjusting range, can be transplanted and will not be disturbed.

DETAILED DESCRIPTION OF THE PREFERRED EMBODIMENT

EXAMPLE I

Figure 1:
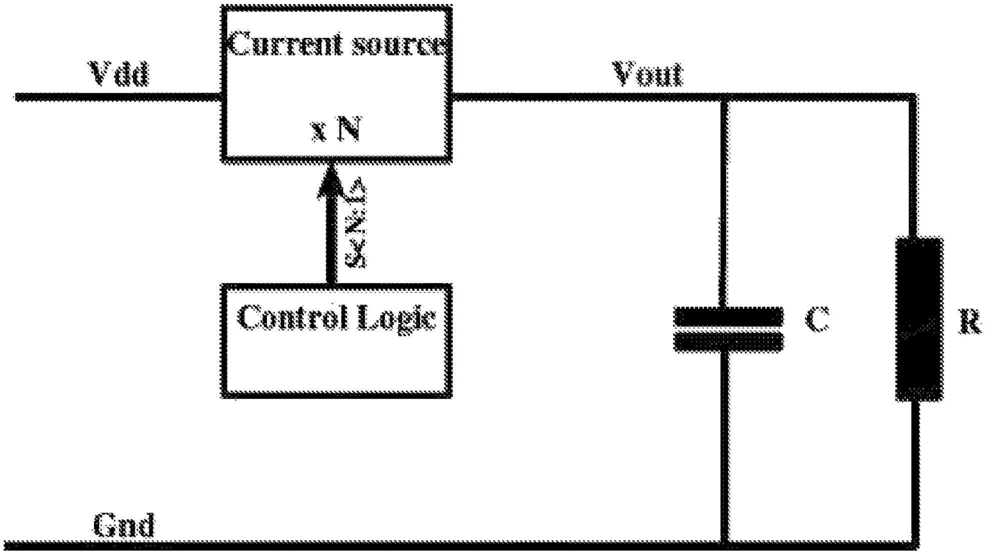
FIG. 1 is a schematic view of the prior art.
Figure 2:
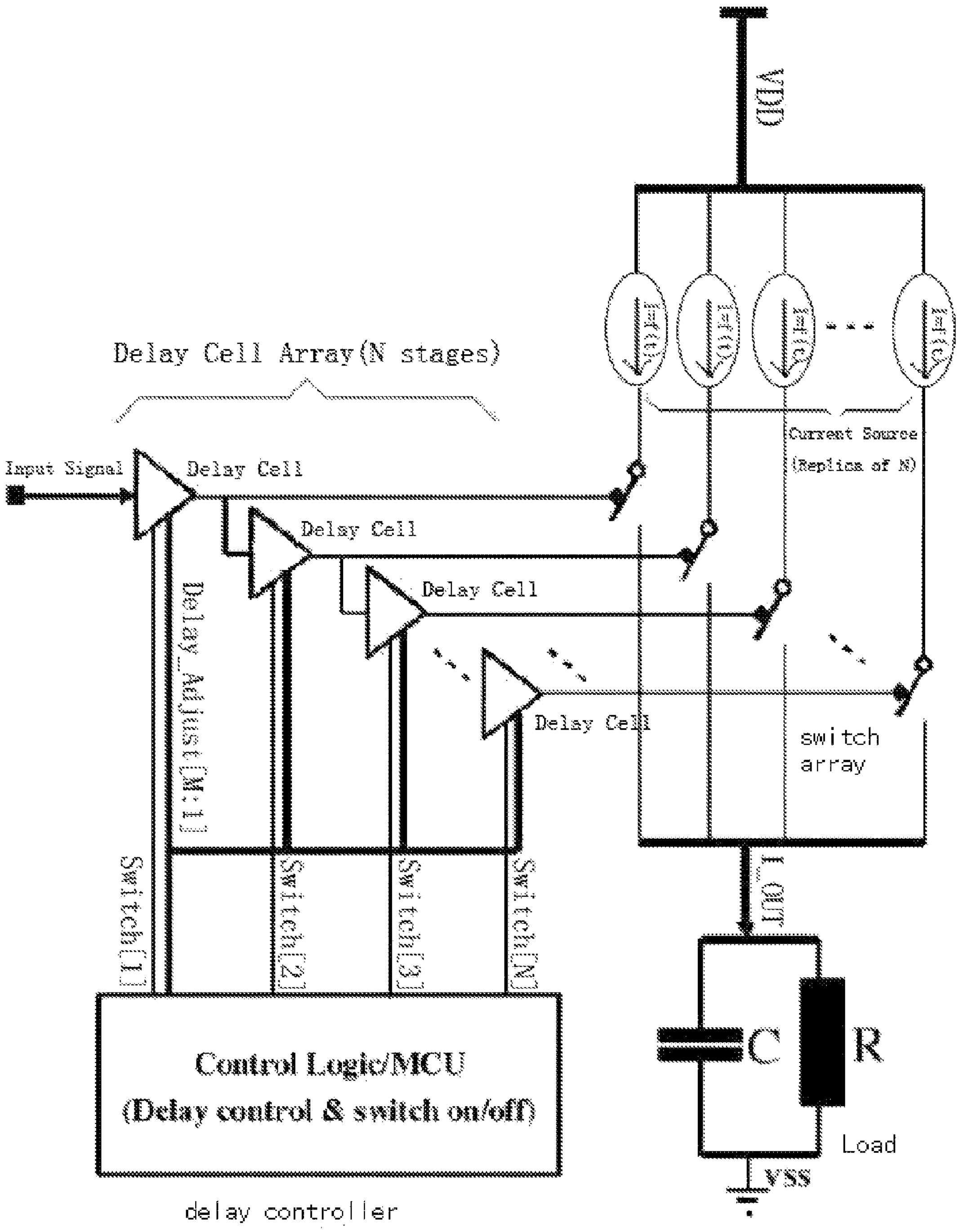
FIG. 2 is a schematic view of an controller according to a preferred embodiment of the present invention.

Referring to FIG. 2 of the drawings, a stage by stage delay current-summing slew rate controller is shown, which includes a delay controller, a delay cell array, a current source array, a switch array, a load. The delay cell array includes N delay cells, the switch array includes N switches, and the switch includes N current sources, wherein N>1. The delay controller is connected with the control ports of the delay cells respectively, and the delay cells are connected with the control terminal of the switches respectively. One of the connecting terminals of the switch is connected with the output end of the current source, and the other end of the connecting terminals of the switch is connected with one end of the load, and the other end of the load is connected to the ground.

The switches are connected with the current sources respectively in series.

The input ends of the current sources are connected with the power supply in parallel.

The current source is mirror current source.

The work flow of the stage by stage delay current-summing slew rate controller is illustrated as follows.

Firstly, the delay cell array delays the input signal, the delay controller controls the delay time of each delay cell and gates the delay cell needed to work, then output signals of delay cells of the delay cell array control the corresponding switches of the switch array respectively, lastly the current sources of the current source array combine and output current under the control of the corresponding switches respectively. The output current drives the load to produce output voltage. During the working process, the output current and voltage are controllable, so that the output voltage slew rate can be controlled.

The delay controller also controls the amount of the delay of each delay cell, and the number of delay cell needed to work may change according to the actual need during the working process.

The delay cells of the delay cell array produce N-phase switch signals of different delay to drive the corresponding switches of the switch array and control the current sources, wherein N>1.

The switch of the switch array is to control the on and off of the corresponding current source of the current source array.

The load is driven by the N current sources of the current source array after combined, wherein N>1.

The output signals are produced by input signal passing through the 1 to N delay cells of the delay cell array respectively. The effectiveness of the output signals is determined by the input signal.

The output signals controlling the connection between the connecting terminal of the switches of and the load means that when the output signal is effective, the connecting terminal and the load are connected; when output signal is ineffective, the connecting terminal and the load are disconnected.

The principle of the stage by stage delay current-summing slew rate controller is illustrated as follows.

$$I_{OUT}(t)=\sum_{n=1}^{n=N} f(t-n*\Delta t)$$

When delta(t)=0, the current is not changed, so that SR does not need to be adjusted.

The current is becoming lager with time. When N is bigger, the adjusting is more precise; when the delta(t) is higher, the adjusting is more coarse.

Overall, $I_{out}$ is a combined current. For example, when $I_{out}(t)=I_0*u(t)$ (step signal), $I_{out}$ is a step-like section curve with N section of $I_0$, $2*I_0$, . . . $N*I_0$ respectively. The value $I_{out}$ of each section is constant, and the difference between the adjacent values of $I_{out}$ is $I_0$. The output wave is a steeper and steeper ascending wave. Adjusting N and delta(t) can change the width of each wave section and the overall ascending speed (equivalent slop). If N is big enough, the current is almost continuous, and rise linearly with time. When N→∞, $\partial I/\partial = I_0/\Delta t$ (constant).

Because $SR=(I(t)-V_{OUT}(t)/R)/C$, if SR needs to be constant, the compensate current I-compensate$=V_{OUT}(t)/R=I_C*t/(R*C)$, $\partial I/\partial = I_C/(R*C)$, that is to demand $I_C/(R*C)=I_0/\Delta$, wherein $I_c$ is the current of the capacitor that should be approximate equal to 0, so that $(R*C)=\Delta t$.

If change $I_{out}(t)$ various kinds of output current can be produced by superposition. This becomes an extended application of this method.

Change f(t) or Δt and N, various kinds of output current can be produced by superposition. The superposition result can produce various driving effect, so that the slew rate of the output voltage can be customized.

Figure 4:
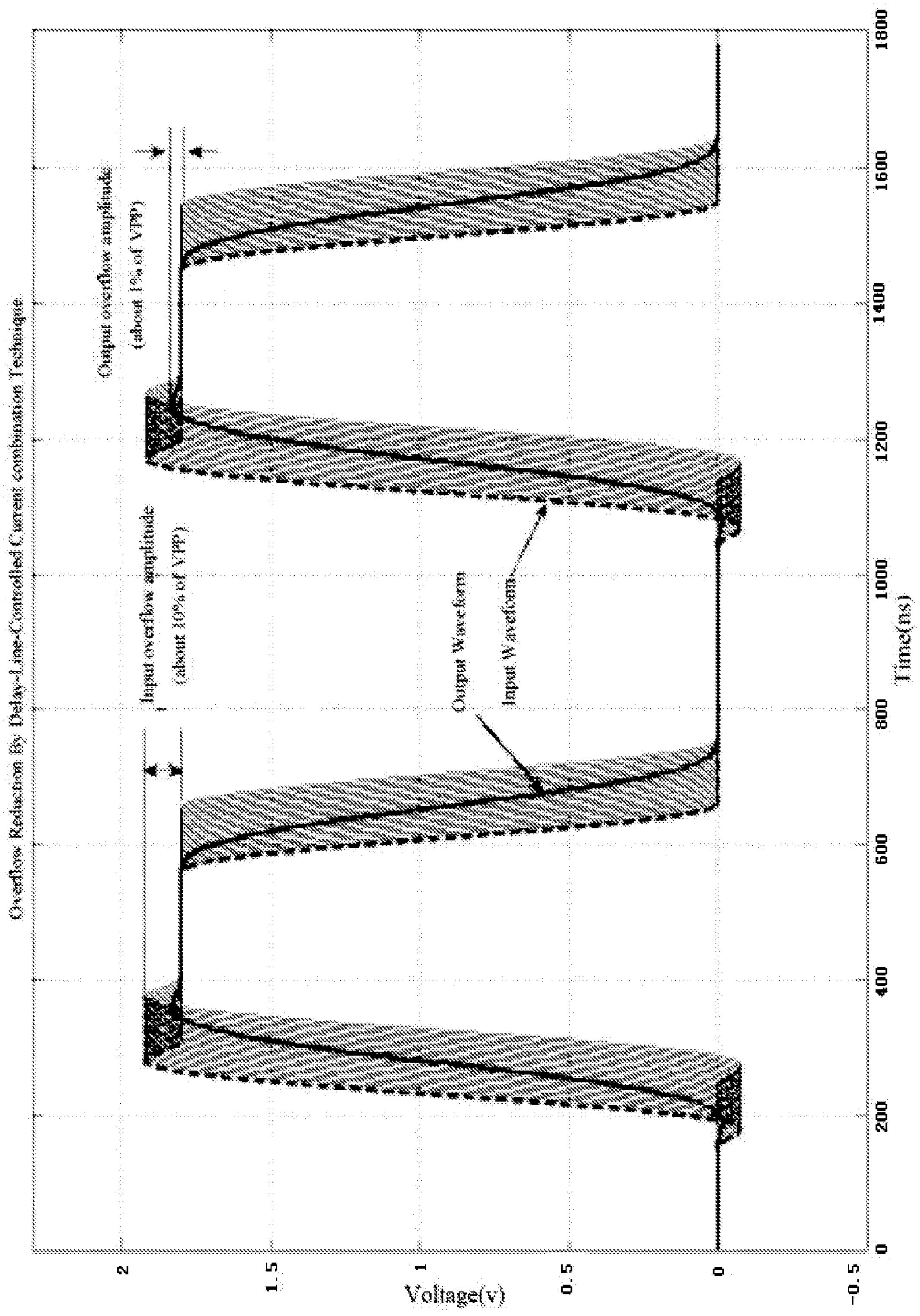
FIG. 4 is a schematic view of a wave illustrating the principle of the present invention.

FIG. 4 is a Matlab simulation of the mathematical principle of the present invention. Superposition the N signals, and average the superposition result. Draw a black solid line on the original wave of broken line. It is obvious that the overshooting is greatly lowered.

EXAMPLE II

Figure 3:
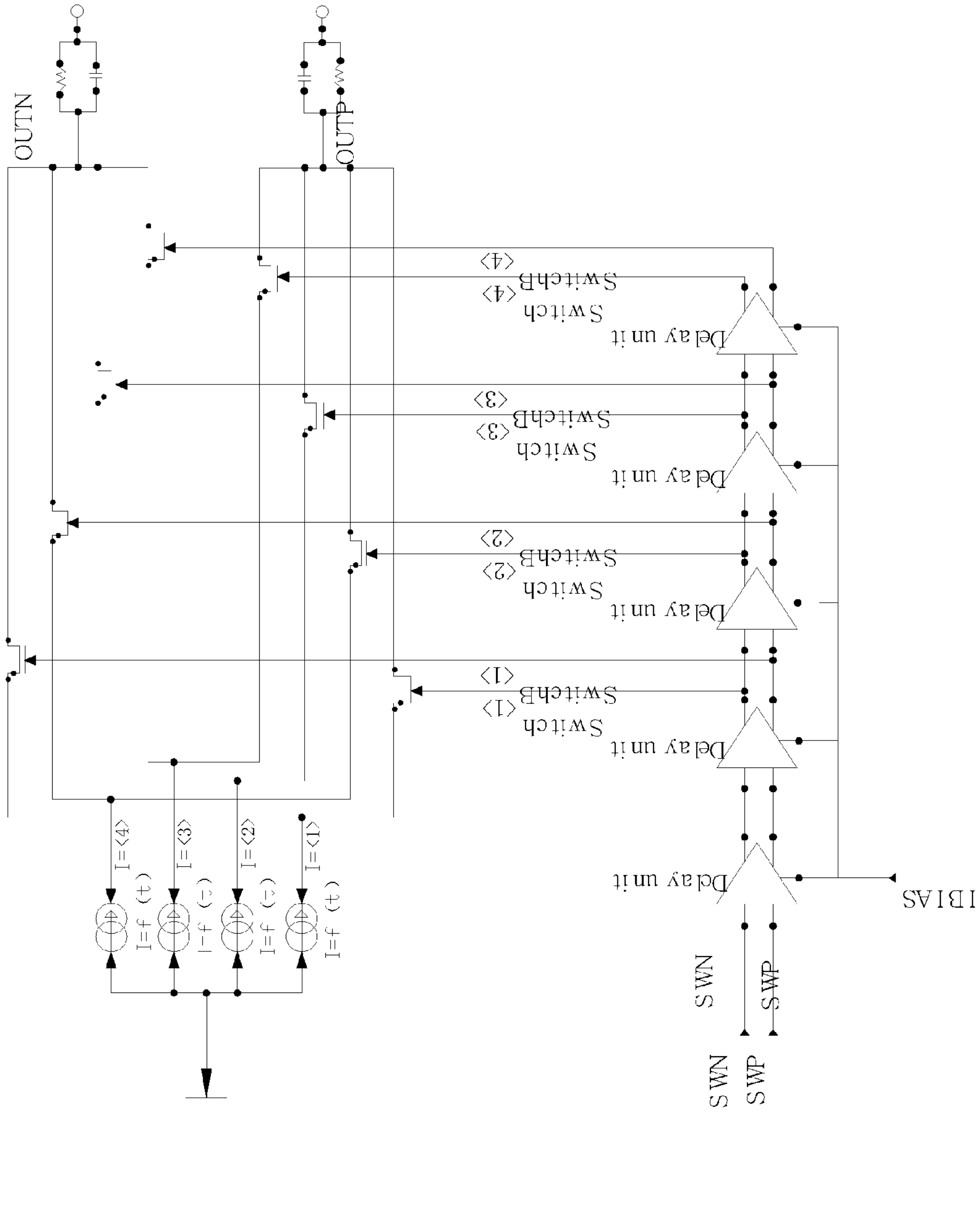
FIG. 3 is a schematic view of a application circuit according to the preferred embodiment of the present invention.

Referring to FIGS. 2 and 3 of the drawings, the present invention is applied to 4 stages delay current-summing slew rate controller, and the circuit is illustrated as follows.

The 4 stages delay current-summing slew rate controller includes a delay controller, a delay cell array with 4 delay cells, a current source array with 4 current sources, a switch array with 4 switches, and a load. The 4 switches of the switch array are connected with 4 current sources of the current source array respectively in series.

The delay controller is connected with the control ports of the 4 delay cells respectively, and the 4 delay cells are connected with the control terminal of the 4 switches of the switch array respectively. One of the connecting terminals of the switches are connected with the output end of the 4 current sources respectively, and the other end of the connecting terminals of the switches are connected with one end of the load, and the other end of the load is connected to the ground.

As shown in FIG. 3, the left is the delay line, the current bias signal is provided by Ibias.

Switch<4:1> and SwitchB<4:1> are two pair of difference controlling signals. The up-right shows 4 current sources biased with constant current, and connected with 4 pairs of difference switch tubes on the bottom thereof. Two outputs are connected with the same load.

Because the delay switches produce increasing current with time, the increasing part is used to compensate the increasing current loss of R due to the increasing time and voltage, so that the output voltage is linear.

EXAMPLE III 20 stages delay current-summing slew rate controller is used to depress the overshooting. The principle of the 20 stages delay current-summing slew rate controller is same with the 4 stages delay current-summing slew rate controller.

The work flow is illustrated as follows. Firstly, the delay cell array delays the input signal, the delay controller controls the delay time of each delay cell and gates the delay cell needed to work, then output signals of delay cells of the delay cell array control the corresponding switches of the switch array respectively, lastly the current sources of the current source array combine and output current under the control of the corresponding switches respectively. The output current drives the load to produce output voltage. During the working process, the output current and voltage are controllable, so that the output voltage slew rate can be controlled.

What is claimed is:

1. A stage by stage delay current-summing slew rate controller, comprising: a delay cell array, a delay controller, a current source array, a switch array, a load, wherein said delay cell array includes N delay cells, said switch array includes N switches, and said switch includes N current sources, wherein N>1, wherein said delay controller is connected with said control ports of said delay cells respectively, and said delay cells are connected with said control terminal of said switches respectively, wherein one of said connecting terminals of said switch is connected with said output end of said current source, and said other end of said connecting terminals of said switch is connected with one end of said load, and said other end of said load is connected to ground.

2. The stage by stage delay current-summing slew rate controller, as recited in claim 1, wherein said switches are connected with said current sources respectively in series.

3. The stage by stage delay current-summing slew rate controller, as recited in claim 2, wherein said input ends of said current sources are connected with said power supply in parallel.

4. The stage by stage delay current-summing slew rate controller, as recited in claim 2, wherein said current source is mirror current source.

5. The stage by stage delay current-summing slew rate controller, as recited in claim 2, wherein the work process is that firstly, said delay cell array delays said input signal, said delay controller controls said delay time of each delay cell and gates said delay cell needed to work, then output signals of delay cells of said delay cell array control said corresponding switches of said switch array respectively, lastly said current sources of said current source array combine and output current under said control of said corresponding switches respectively, and said output current drives said load to produce output voltage, wherein during the working process, said output current and voltage are controllable, so that said output voltage slew rate can be controlled.

6. The stage by stage delay current-summing slew rate controller, as recited in claim 5, wherein said delay controller also controls said amount of said delay of each delay cell, while controlling the gate of said delay cell needed to work.

7. The stage by stage delay current-summing slew rate controller, as recited in claim 5, wherein said delay cells of said delay cell array produce N-phase switch signals of different delay to drive said corresponding switches of said switch array and control said current sources, wherein N>1; said switch of said switch array is to control on and off of said corresponding current source of said current source array; said load is driven by said N current sources of said current source array after combined, wherein N>1.

8. The stage by stage delay current-summing slew rate controller, as recited in claim 5, wherein said output signals are produced by input signal passing through said 1 to N delay cells of said delay cell array respectively; said effectiveness of said output signals is determined by said input signal.

9. The stage by stage delay current-summing slew rate controller, as recited in claim 5, wherein said output signals controlling said connection between said connecting terminal of said switches of and said load means that when said output signal is effective, said connecting terminal and said load are connected; when output signal is ineffective, said connecting terminal and said load are disconnected.

10. The stage by stage delay current-summing slew rate controller, as recited in claim 5, wherein a principle is that $$I_{OUT}(t) = \sum_{n=1}^{n=N} f(t - n*\Delta t);$$

when delta(t)=0, said current is not changed; said current is becoming lager with time; when N is bigger, the adjusting is more precise; when said delta(t) is higher, said adjusting is more coarse.

* * * * *

UNITED STATES PATENT AND TRADEMARK OFFICE

CERTIFICATE OF CORRECTION

| | | |
|---|---|---|
| PATENT NO. | : 7,795,942 B2 |  |
| APPLICATION NO. | : 12/475523 | |
| DATED | : September 14, 2010 | |
| INVENTOR(S) | : Yong Quan and Guosheng Wu | |

It is certified that error appears in the above-identified patent and that said Letters Patent is hereby corrected as shown below:

On the Title page item (73), the name of the assignee should be IPGoal Microelectronics (SiChuan) Co., Ltd. instead of IPGloal Microelectronics (SiChuan) Co., Ltd..

Signed and Sealed this
First Day of February, 2011

David J. Kappos
*Director of the United States Patent and Trademark Office*